(12) United States Patent
Tamir (10) Patent No.: US 10,468,964 B1
(45) Date of Patent: Nov. 5, 2019

(54) DETECTION AND COMPENSATION OF POWER PHASE LOSS

(71) Applicant: PHASOR LTD, Raanana (IL)

(72) Inventor: Oren Tamir, Raanana (IL)

(73) Assignee: PHASOR LTD, Raanana (IL)

( * ) Notice: Subject to any disclaimer, the term of this patent is extended or adjusted under 35 U.S.C. 154(b) by 0 days.

(21) Appl. No.: 16/373,878

(22) Filed: Apr. 3, 2019

(51) Int. Cl.
*H02M 1/08* (2006.01)
*G01R 19/25* (2006.01)
*H02M 7/06* (2006.01)
*H02M 1/00* (2006.01)
*H02H 7/12* (2006.01)
*H02H 3/08* (2006.01)

(52) U.S. Cl.
CPC .......... *H02M 1/08* (2013.01); *G01R 19/2513* (2013.01); *H02M 7/06* (2013.01); *H02H 3/083* (2013.01); *H02H 7/1216* (2013.01); *H02M 1/081* (2013.01); *H02M 2001/0009* (2013.01)

(58) Field of Classification Search
CPC ...... H02M 1/081; H02H 3/083; H02H 7/1216
USPC .......... 363/36, 74, 78; 323/217, 910
See application file for complete search history.

(56) References Cited

U.S. PATENT DOCUMENTS

| 5,514,978 A * | 5/1996 | Koegl | G01R 31/346 318/690 |
| 6,141,196 A * | 10/2000 | Premerlani | H02H 1/0092 361/115 |
| 2012/0176120 A1* | 7/2012 | Jefferies | G01R 15/183 324/124 |
| 2013/0070373 A1* | 3/2013 | Jefferies | H02H 3/006 361/31 |

* cited by examiner

*Primary Examiner* — Gary A Nash
(74) *Attorney, Agent, or Firm* — Browdy and Neimark, PLLC (57) ABSTRACT

Systems and methods are provided for detecting and compensating for loss of a phase of a three-phase power source, elements of the system including: a sensing unit, which measures current and voltage levels of each phase of the three-phase power source; a switching unit having three primary relays and three backup relays; and a microcontroller, configured to receive measurements from the sensing unit, to determine from the measurements a lost phase and a less-loaded phase of the two remaining phases, and responsively to activate the switching unit to disconnect the lost phase and to connect the less loaded phase to provide backup power in place of the lost phase.

11 Claims, 5 Drawing Sheets

DETECTION AND COMPENSATION OF POWER PHASE LOSS

FIELD OF THE INVENTION

The present invention generally relates to power grid operation and specifically to three-phase power supplies.

BACKGROUND

Three-phase power is often supplied to a site of a residential or business consumer even when most or all devices at the site require only a single phase of the three phases. If there is a failure of one phase, three-phase devices are generally protected by three-phase relays which cut off all power to such devices. However, single phase devices may continue to operate if they are connected to operating phases. Devices that are connected to that phase that is lost become inoperative, even though the consumer continues to receive power from the other phases. The lost phase may cause inconvenience and economic loss.

SUMMARY

The present invention provides a system and methods for enabling any phase of a three phase power supply to provide backup power in the event that one or two of the other phases is lost.

In embodiments of the present invention, a system is provided having a sensing unit, which measures current and voltage levels of each phase of the three-phase power source; a switching unit having three primary relays and three backup relays; and a microcontroller, configured to receive measurements from the sensing unit, to determine from the measurements a lost phase and a less-loaded phase of the two remaining phases, and responsively to activate the switching unit to disconnect the lost phase and to connect the less loaded phase to provide backup power in place of the lost phase.

The present invention provides a phase compensation circuit, for detecting and compensating for loss of a phase of a three-phase power source, comprising:

a sensing unit, comprising sensors configured to measure current and voltage levels of each phase of the three-phase power source;

a switching unit comprising three primary relays, each primary relay normally closed to connect a respective phase of the three-phase power source to a respective phase output load line, and three backup relays, each backup relay normally open and when closed forming a connection between two output load lines; and a microcontroller, configured to receive measurements from the sensing unit, to determine from the measurements a lost phase and a backup phase, and responsively to activate the switching unit to disconnect the lost phase from its respective output load line and to connect the backup phase to the lost phase output load line to provide backup power in place of the lost phase.

According to some embodiments of the present invention the microcontroller is configured to activate the switching unit by opening a primary relay to disconnect the lost phase from a load, and by closing a backup relay to connect the remaining phase to the load.

According to some embodiments of the present invention a direct current (DC) power unit configured to convert the three-phase power source to DC power to provide power to the microcontroller.

4. The phase compensation circuit of claim 1, wherein determining the backup phase comprises comparing electric currents provided by each of two remaining phases and selecting the backup phase as the less-loaded phase.

5. The phase compensation circuit of claim 1, wherein determining the backup phase comprises comparing an electric current of a remaining phase with a preset electric current level and selecting the remaining phase as the backup phase only when the electric current of the remain phase is less than the preset electric current level.

6. The phase compensation circuit of claim 1, wherein determining the backup phase comprises comparing real power provided by each of two remaining phases and selecting the backup phase as the less-loaded phase.

7. The phase compensation circuit of claim 1, wherein determining the backup phase comprises comparing real power of a remaining phase with a preset real power level and selecting the remaining phase as the backup phase only when the real power of the remain phase is less than the preset real power level.

8. The phase compensation circuit of claim 5, wherein the microcontroller is further configured to receive the preset level from the front panel.

9. The phase compensation circuit of claim 1, wherein the microcontroller is further configured to provide a visual and/or audio user alert at the front panel as an indication of the lost phase.

10. The phase compensation circuit of claim 1, wherein the microcontroller is further configured to provide at the front panel one or more of an indication of the substitution of the backup phase, a power consumption and a margin between the power consumption and a preset maximum/safety level.

11. A method for detecting and compensating for loss of a phase of a three-phase power source, comprising:

providing a sensing unit configured to measure current and voltage levels of each phase of the three-phase power source;

providing a switching unit (32) having three primary relays, each primary relay normally closed to connect a respective phase of the three-phase power source to an output load line, and three backup relays, each backup relay normally open and when closed forming a connection between two output load lines; and providing a microcontroller (34), configured to receive measurements from the sensing unit, to determine from the measurements a lost phase and a remaining phase, and responsively to activate the switching unit to disconnect the lost phase and to connect the remaining phase to provide backup power in place of the lost phase.

BRIEF DESCRIPTION OF DRAWINGS

In the following detailed description of various embodiments, reference is made to the following drawings that form a part thereof, and in which are shown by way of illustration specific embodiments by which the invention may be practiced, wherein.

DETAILED DESCRIPTION OF THE INVENTION

In the following detailed description of various embodiments, it is understood that other embodiments may be utilized and structural changes may be made without departing from the scope of the present invention.

Figure 1:
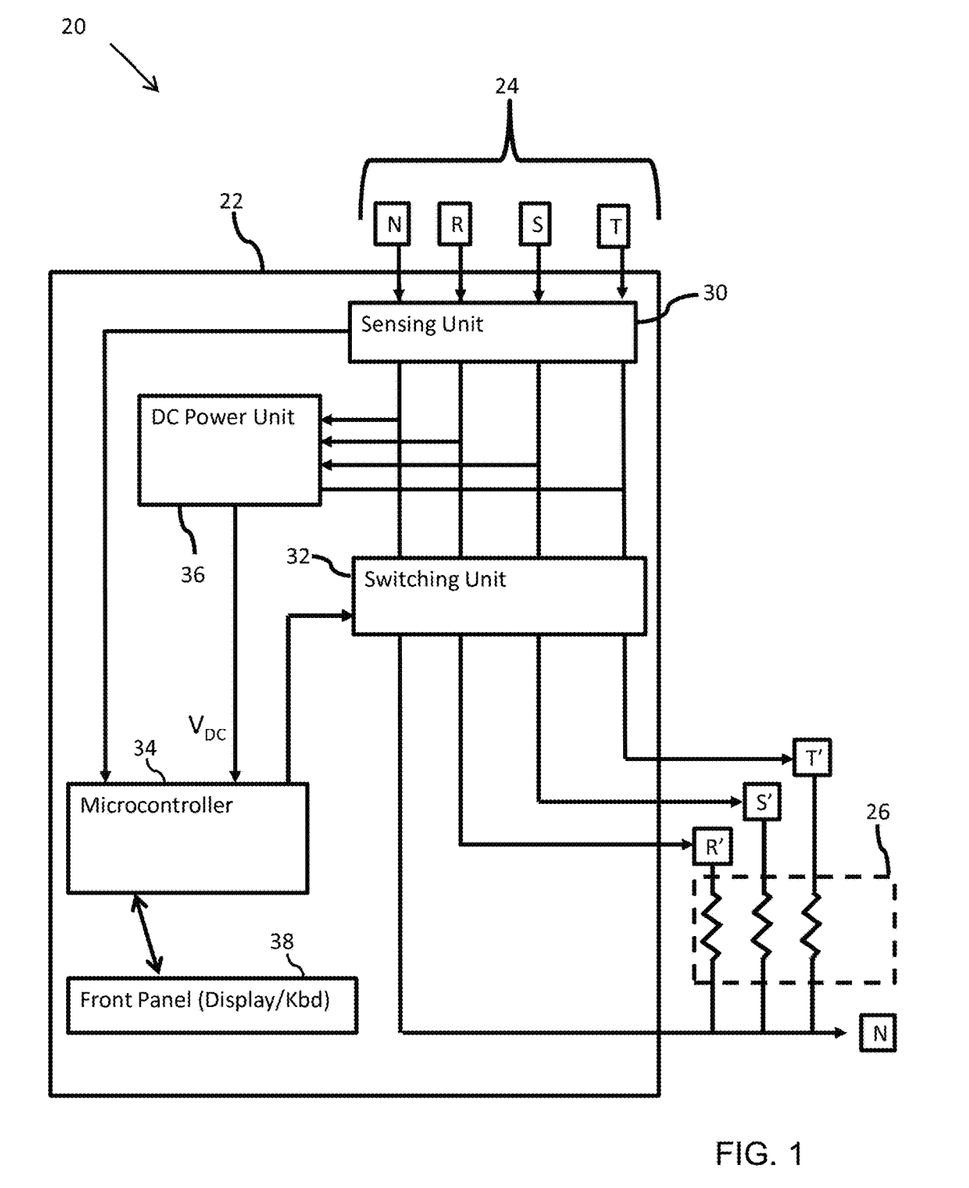
FIG. 1 is a schematic illustration of a three-phase electrical power system including a phase compensation circuit, in accordance with an embodiment of the present invention.

FIG. 1 is a schematic illustration of a three-phase electrical power system 20 including a phase compensation circuit 22 for detecting and compensating for loss of a phase of a three-phase power source, in accordance with an embodiment of the present invention. The phase compensation receives, as input, three-phase input power 24, typically with a four-wire configuration that includes a neutral line, as indicated in the figure. The phases of the three-phase power input are commonly labelled R, S, and T phases, respectively. The three-phase power input is typically provided by an electric generator, such as an on-site generator or a generator of a utility grid.

In embodiments of the present invention, the phase compensation circuit 22 provides multiple loads 26 with single phase power, that is, each individual load 26 is powered by one of the output phases, labelled as R', S', and T', respectively. All loads are connected to the common neutral line. In the event of a loss of one or two of the input phases (R, S, or T), the phase compensation circuit 22 switches a backup phase to operate in place of the lost phase or phases.

The phase compensation circuit 22 includes a sensing unit 30, a switching unit 32, and a microcontroller 34. A direct current (DC) power unit 36 may provide DC power (indicated as $V_{DC}$) to the microcontroller. A user interface, such as a front panel 38, which may include a display, a keyboard, and/or a speaker, may provide status indications as well as a means for a user to change operating configurations of the microcontroller 34, as described further hereinbelow. The front panel may also provide remote connections, permitting remote user interaction with the phase compensation circuit 22.

The sensing unit 30, described in further detail hereinbelow with respect to FIG. 2, measures electric current and voltage levels of each input phase, at the input of the phase compensation circuit 22, and provides signals indicative of these levels to the microcontroller 24. If there is a loss of one phase, for example due to a power surge on that phase elsewhere on the network, the voltage drop is sensed by the sensing unit 30, which in turn provides the voltage level to the microcontroller 34. The microcontroller 34 determines that a phase is lost and operates the switching unit 32 to decouple the bad (lost) phase. In parallel, the microcontroller 34 selects one of the remaining two operating phases to provide backup power to the loads 26 that were connected to the bad phase. The microcontroller 34 may determine which phase to select as the backup phase by comparing electric current levels of the remaining two phases (i.e., the phases that still provide power), and selecting the less loaded phase. Alternatively, the determination may be random, or based on a calculation of real power, that is, as the product of voltage and electric current.

After selecting a phase for providing backup power, the microcontroller 34 operates the switching unit 32 to connect the selected backup phase as a substitute for the lost phase. The microcontroller may also compare the electric current and/or power use of the selected backup phase to a preset safety level and connect the selected phase as backup only if the preset level is not surpassed. Preset safety levels for the phases may be set by a user by means of the front panel 38.

Upon determining that a phase is lost, the microcontroller 34 may provide a visual and/or audio user alert at the front panel 38. In addition, the microcontroller 34 may visually display an indication of the substitution of the selected backup phase for the lost phase, as well as providing additional status information, such as the power consumption and the margin between the power consumption and the preset safety level.

The microcontroller 34 may be any processing system including internal or external memory and digital outputs for driving the switching unit. Typically the microcontroller also includes analog-to-digital (A/D) inputs for receiving the signals of the sensing unit 30. A typical microcontroller may be the ATmega 328P-AU processor from Atmel®.

Figure 2:
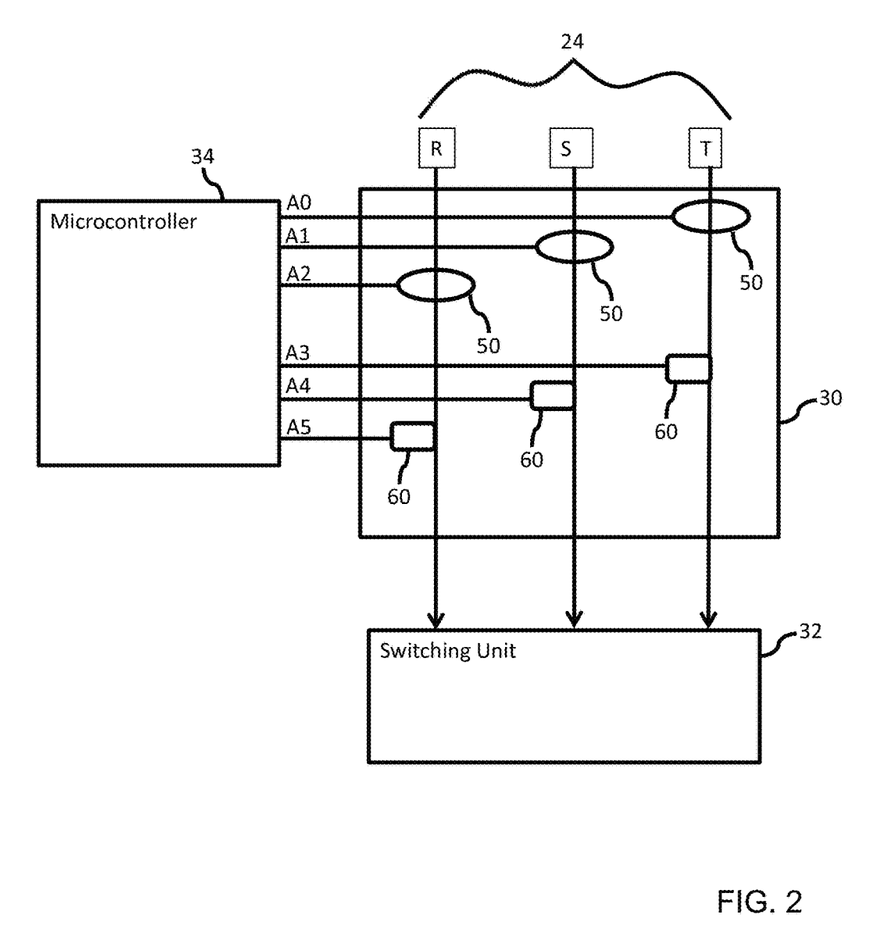
FIG. 2 is a schematic illustration of a sensing unit of the phase compensation circuit, in accordance with an embodiment of the present invention.

FIG. 2 is a schematic illustration showing details of the sensing unit 30, in accordance with an embodiment of the present invention. The sensing unit 30 includes three current sensors 50, each configured to measure current of one input phase of the three-phase input power. The sensing unit 30 also includes three voltage sensors 60, each configured to measure the voltage of one input phase of the three-phase input power. In one embodiment, the current and voltage sensors provide analog signals to analog-to-digital (A/D) inputs of the microcontroller 34, indicated as A0-A5. An exemplary current sensor may be a Nuvotem Talema current transformer. An exemplary voltage sensor may be a ZMPT101B Ultra-micro voltage transformer, from Nanjing Zeming Electronics Co.

Alternatively, either or both types of sensors may include A/D converters, sampling the respective currents and voltages and providing digitals signals to the microcontroller 34. The three phases, respectively R, S, and T, are conveyed to the switching unit 32 from the sensing unit.

Figure 3:
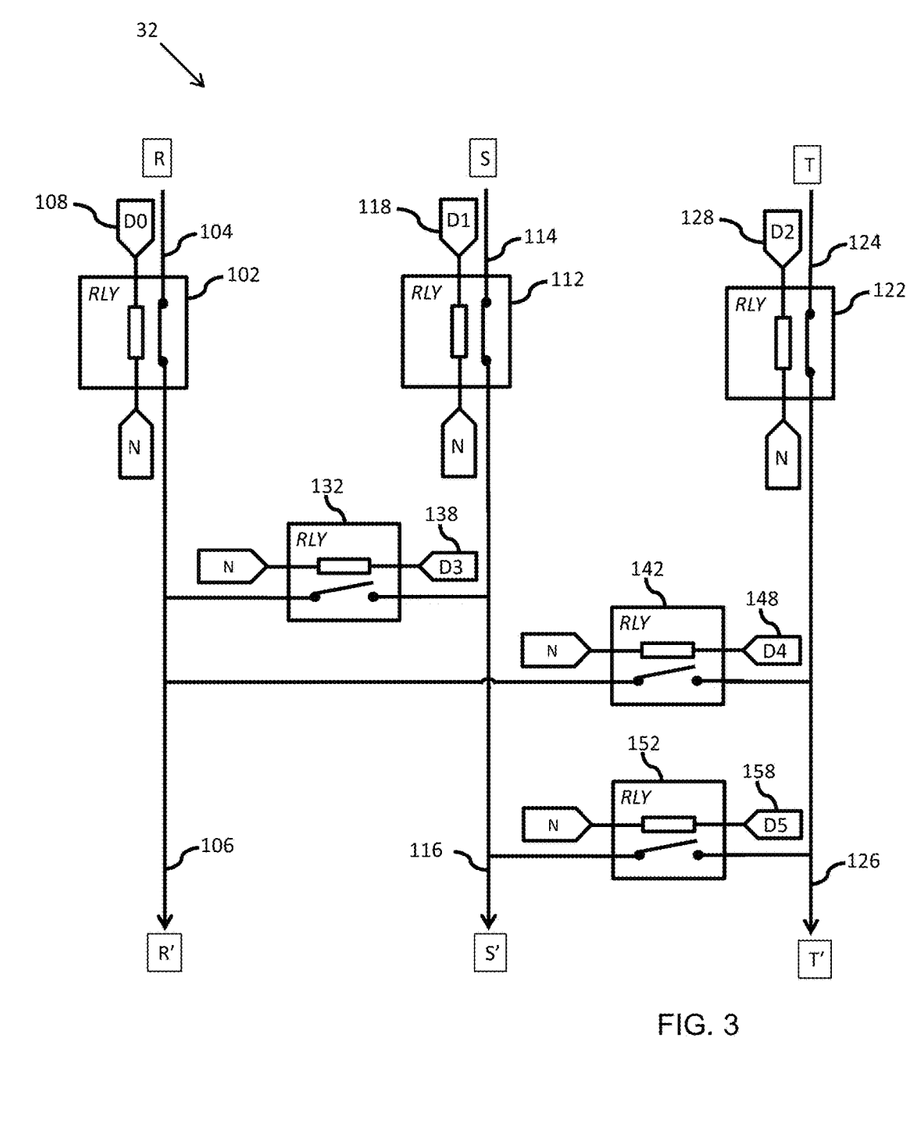
FIG. 3 is a schematic illustration of a switching unit of the phase compensation circuit, in accordance with an embodiment of the present invention.

FIG. 3 is a schematic illustration showing details of the switching unit 32, in accordance with an embodiment of the present invention. The switching unit 32 includes three primary relays 102, 112, and 122, each primary relay normally closed to connect a respective phase of the three-phase power source to an output load line. That is, for example, relay 102 connects input line 104, carrying phase R, to output line 106; relay 112 connects input line 114, carrying phase S, to output line 116; and relay 122 connects input line 124, carrying phase T, to output line 126. Each primary relay also includes one or more control input, indicated as respective inputs 108, 118, and 128. Control inputs are typically received from digital outputs of the microcontroller 34. The primary function of each control input is to cause its corresponding relay to open if the respective phase is lost, that is, if the microcontroller determines that the given phase is no longer providing a sufficient voltage.

The switching unit 32 also includes three backup relays 132, 142, and 152, each backup relay normally open. Backup relay 132, when closed, connects output line 106 of phase R with output line 116 of phase S. Backup relay 142, when closed, connects output line 116 of phase S with output line 126 of phase T. Backup relay 152, when closed, connects output line 126 of phase T with output line 106 of phase R.

When a backup phase is needed to compensate for a lost phase, the microcontroller 34 opens the primary relay of the lost phase and then closes the backup relay connecting between the output line of the lost phase the output line of the selected backup phase. For example, if phase R is lost, the microcontroller will open relay 102 to disconnect phase R from the output line 106 (R') and will close either relay 132 or relay 142 to connect one of either phase S or phase T to the output line 106. As described above, the microcontroller may determine which of the operating phases to connect to the output line of the lost phase based on which operating phase is less loaded, that is, based on which operating phase has greater spare capacity.

In some embodiments, the relays may be latching relays, such as the G9TA-K1ATH General Purpose Relay from Omron Corporation. Such relays typically require that an extra control line be provided to each relay (not shown) to reset the relays to a known state when operation begins.

Figure 4:
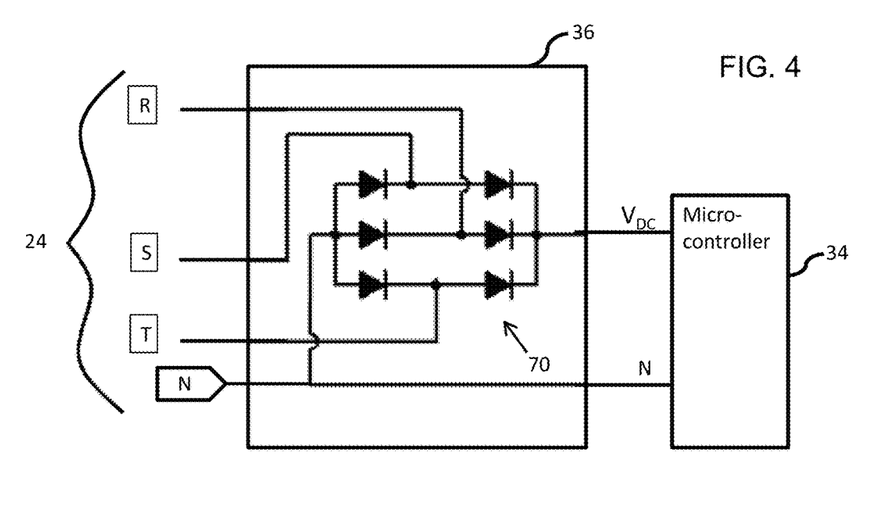
FIG. 4 is a schematic illustration of a direct current (DC) power unit of the phase compensation circuit, in accordance with an embodiment of the present invention.

FIG. 4 is a schematic illustration of the DC power unit 36, in accordance with an embodiment of the present invention. The power unit 36 receives the phases and neutral line of the three-phase input power 24 and rectifies the power to generate a DC voltage $V_{DC}$ that is provided to power the microcontroller 34. The rectifying circuit may include a three-phase diode bridge 70 or other known passive or active circuits for current rectification.

Figure 5A:
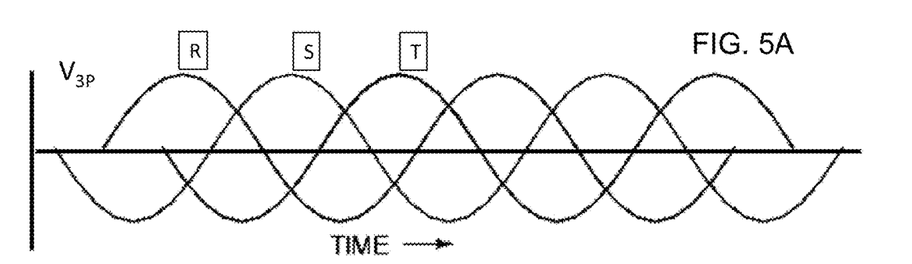
FIGS. 5A and 5B are graphs of power waveforms of the a direct current (DC) power unit output, in accordance with an embodiment of the present invention.
Figure 5B:
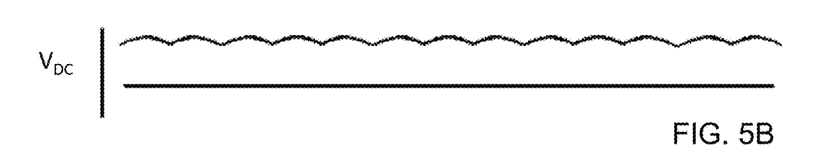

FIGS. 5A and 5B are graphs of power waveforms, FIG. 5A showing the three input phases, R, S, and T, respectively, and 5B showing a rectified DC wave generated by the DC power unit 36, in accordance with an embodiment of the present invention. If one phase drops, the others will still compensate to provide a rectified DC wave for the microcontroller.

Figure 6:
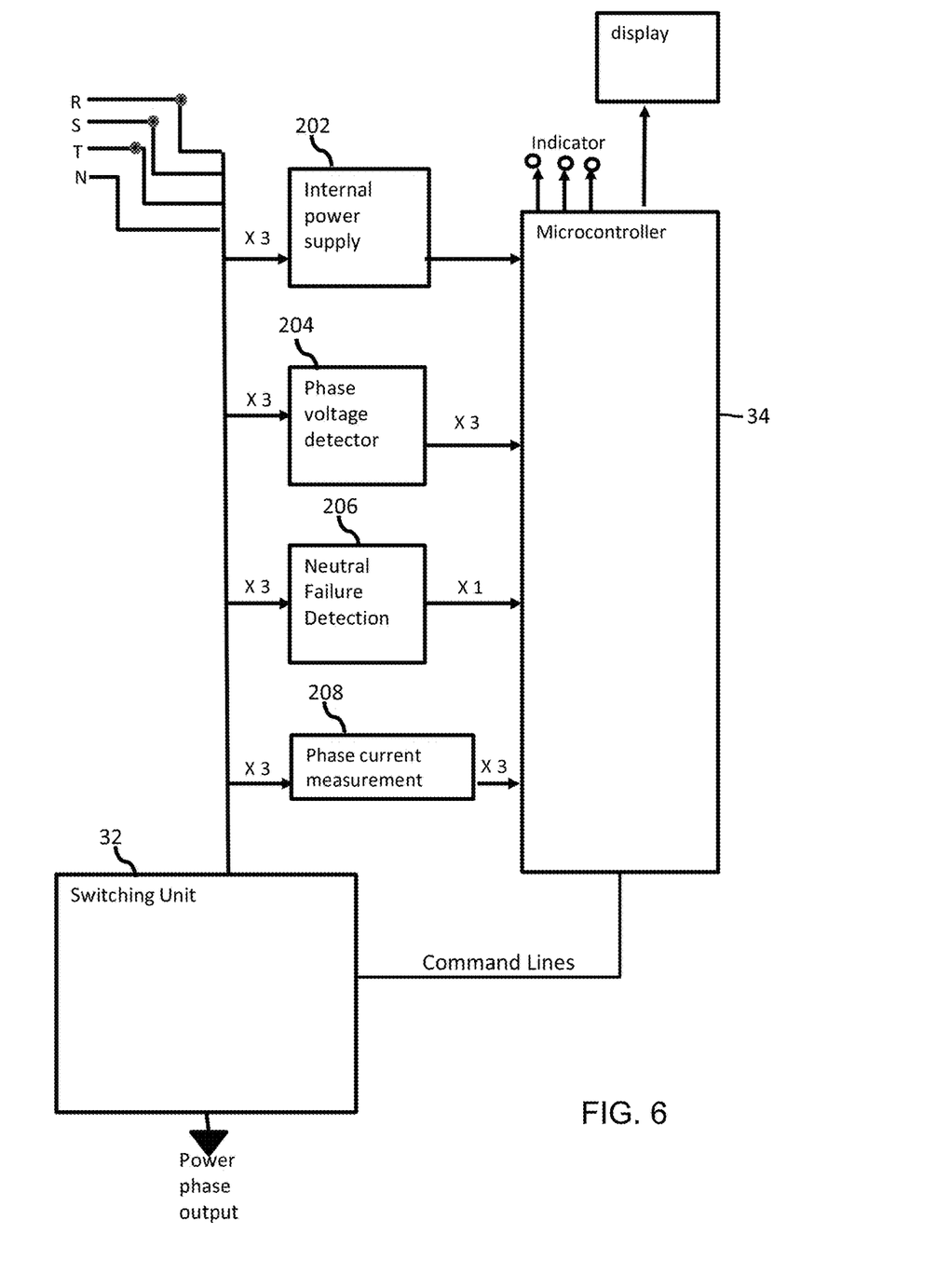
FIG. 6 is a schematic illustration of an alternative three-phase electrical power system including a phase compensation circuit, in accordance with an embodiment of the present invention.

FIG. 6 is a schematic illustration of an alternative three-phase electrical power system including a phase compensation circuit, in accordance with an embodiment of the present invention. As indicated, the microcontroller 34 outputs control lines to control the relays of switching unit 32. The microcontroller may be configured to receive more inputs than indicated above with respect to FIG. 2. As shown in FIG. 6, the microcontroller receives output of a power supply 202 as described above and of phase voltage measurements 204, which indicate whether a phase is lost. The microcontroller may also receive output of a neutral failure detector 206, which may be applied to a determination that all relays of switching unit 32 should be opened, to prevent damage due to a lost neutral. Also, the microcontroller may receive output of phase current measurements 208. If any currents of backup phases are above preset values for each phase, then the phase with two high a current is not used as a backup in the event of a second phase falling.

The system of the present invention may be integrated for example in houses, ships, airplanes, etc. or in any system receiving a three-phase power source. It will be appreciated that the system of the present invention may be connected to any three-phase power source such as an electric company, a three-phase generator, or any other three-phase power source.

It will be appreciated that in cases in which one or two of the three phases malfunction, the loads may require more power than the working phase(s) can supply. In such situations, a three-phase circuit breaker will typically break the electrical circuit due to an overload. The alert at the front panel may notify a user of a pending overload before the circuit breaker is activated, so that the user may disconnect electric appliances, enabling the working phase(s) to supply the user's needs.

The microcontroller of the phase compensation circuit may be a processor, meaning any one or more microprocessors, central processing units (CPUs), computing devices, microcontrollers, digital signal processors, FPGA or like devices. Data storage media, or computer-readable media, may refer to any medium that participates in providing data (e.g., instructions) that may be read by a processor. Such media may take many forms, including but not limited to, non-volatile media, volatile media, and transmission media. Formats described for storing data may include other formats, including tables, relational databases, object-based models and/or distributed databases. In addition, the data may be stored locally or remotely from a device which accesses the data. Software may be tangibly embodied in an information carrier, such as a machine-readable storage device or in a propagated signal, for execution by, or to control the operation of, data processing apparatus, such as a programmable processor or computer, or deployed to be executed on multiple computers at one site or distributed across multiple sites. Method steps associated with the system and process can be rearranged and/or one or more such steps can be omitted to achieve the same, or similar, results to those described herein. It is to be understood that the embodiments described hereinabove are cited by way of example, and that the present invention is not limited to what has been particularly shown and described hereinabove. Rather, the scope of the present invention includes variations and modifications thereof which would occur to persons skilled in the art upon reading the foregoing description and which are not disclosed in the prior art. Changes and modifications, which do not depart from the teachings of the present invention, will be evident to those skilled in the art. Such changes and modifications are within the purview of the present invention and the appended claims.

The invention claimed is:

1. A phase compensation circuit, for detecting and compensating for loss of a phase of a three-phase power source, comprising:
   a sensing unit, comprising sensors configured to measure current and voltage levels of each phase of the three-phase power source;
   a switching unit comprising three primary relays, each primary relay normally closed to connect a respective phase of the three-phase power source to a respective phase output load line, and three backup relays, each backup relay normally open and when closed forming a connection between two output load lines; and
   a microcontroller, configured to receive measurements from the sensing unit, to determine from the measurements a lost phase and a backup phase, and responsively to activate the switching unit to disconnect the lost phase from its respective output load line and to connect the backup phase to the lost phase output load line to provide backup power in place of the lost phase.

2. The phase compensation circuit of claim 1, wherein the microcontroller is configured to activate the switching unit by opening a primary relay to disconnect the lost phase from a load, and by closing a backup relay to connect the remaining phase to the load.

3. The phase compensation circuit of claim 1, further comprising a direct current (DC) power unit configured to convert the three-phase power source to DC power to provide power to the microcontroller.

4. The phase compensation circuit of claim 1, wherein determining the backup phase comprises comparing electric currents provided by each of two remaining phases and selecting the backup phase as the less-loaded phase.

5. The phase compensation circuit of claim 1, wherein determining the backup phase comprises comparing an electric current of a remaining phase with a preset electric current level and selecting the remaining phase as the backup phase only when the electric current of the remain phase is less than the preset electric current level.

6. The phase compensation circuit of claim 5, wherein the microcontroller is further configured to receive the preset level from the front panel.

7. The phase compensation circuit of claim 1, wherein determining the backup phase comprises comparing real power provided by each of two remaining phases and selecting the backup phase as the less-loaded phase.

8. The phase compensation circuit of claim 1, wherein determining the backup phase comprises comparing real power of a remaining phase with a preset real power level and selecting the remaining phase as the backup phase only when the real power of the remain phase is less than the preset real power level.

9. The phase compensation circuit of claim 1, wherein the microcontroller is further configured to provide a visual and/or audio user alert at the front panel as an indication of the lost phase.

10. The phase compensation circuit of claim 1, wherein the microcontroller is further configured to provide at the front panel one or more of an indication of the substitution of the backup phase, a power consumption and a margin between the power consumption and a preset maximum/safety level.

11. A method for detecting and compensating for loss of a phase of a three-phase power source, comprising:
providing a sensing unit configured to measure current and voltage levels of each phase of the three-phase power source;
providing a switching unit (32) having three primary relays, each primary relay normally closed to connect a respective phase of the three-phase power source to an output load line, and three backup relays, each backup relay normally open and when closed forming a connection between two output load lines; and
providing a microcontroller (34), configured to receive measurements from the sensing unit, to determine from the measurements a lost phase and a remaining phase, and responsively to activate the switching unit to disconnect the lost phase and to connect the remaining phase to provide backup power in place of the lost phase.

* * * * *

UNITED STATES PATENT AND TRADEMARK OFFICE
CERTIFICATE OF CORRECTION

PATENT NO. : 10,468,964 B1
APPLICATION NO. : 16/373878
DATED : November 5, 2019
INVENTOR(S) : Oren Tamir It is certified that error appears in the above-identified patent and that said Letters Patent is hereby corrected as shown below:

On the Title Page

Add a section and the priority data as follows:
--Related U.S. Application Data
(60) U.S. Provisional Application No. 62/694,249 filed on July 5, 2018.--

Signed and Sealed this
Nineteenth Day of April, 2022

Katherine Kelly Vidal
*Director of the United States Patent and Trademark Office*